United States Patent

Jeon et al.

[11] Patent Number: 5,835,400
[45] Date of Patent: Nov. 10, 1998

[54] FERROELECTRIC MEMORY DEVICES HAVING NONDESTRUCTIVE READ CAPABILITY AND METHODS OF OPERATING SAME

[75] Inventors: Byung-gil Jeon, Kyungki-do; Chul-sung Park, Seoul, both of Rep. of Korea

[73] Assignee: Samsung Electronics Co., Ltd., Suwon, Rep. of Korea

[21] Appl. No.: 947,607

[22] Filed: Oct. 9, 1997

[30] Foreign Application Priority Data

Oct. 9, 1996 [KR] Rep. of Korea ............... 1996 44850

[51] Int. Cl.$^6$ .................................................. G11C 11/22
[52] U.S. Cl. ......................... 365/145; 365/145; 365/149
[58] Field of Search ..................................... 365/145, 149

[56] References Cited

U.S. PATENT DOCUMENTS

| | | | |
|---|---|---|---|
| 4,809,225 | 2/1989 | Dimmler et al. | 365/145 |
| 4,873,664 | 10/1989 | Eaton, Jr. | 365/145 |
| 4,888,733 | 12/1989 | Mobley | 365/145 |
| 5,086,412 | 2/1992 | Jaffe et al. | 365/145 |
| 5,262,982 | 11/1993 | Brassington et al. | 365/145 |
| 5,297,077 | 3/1994 | Imai et al. | 365/145 |
| 5,414,654 | 5/1995 | Kubota et al. | 365/145 |
| 5,424,975 | 6/1995 | Lowrey et al. | 365/145 |
| 5,532,953 | 7/1996 | Ruesch et al. | 365/145 |
| 5,541,870 | 7/1996 | Mihara et al. | 365/145 |
| 5,638,318 | 6/1997 | Seyyedy | 365/145 |

FOREIGN PATENT DOCUMENTS

| | | |
|---|---|---|
| 0278167A2 | 8/1988 | European Pat. Off. . |
| 0293798A2 | 12/1988 | European Pat. Off. . |
| 0709851A2 | 5/1996 | European Pat. Off. . |
| 0740304A2 | 10/1996 | European Pat. Off. . |

*Primary Examiner*—David C. Nelms
*Assistant Examiner*—VanThu Nguyen
*Attorney, Agent, or Firm*—Myers Bigel Sibley & Sajovec

[57] ABSTRACT

Ferroelectric memory devices contain an array of ferroelectric memory cells therein and control circuits for enabling the performance of nondestructive read operations. The memory cells of a device contain a ferroelectric memory cell and each memory cell contains a ferroelectric capacitor having a first electrode electrically coupled to a plate line and an access transistor electrically coupled in series between a bit line and a second electrode of the ferroelectric capacitor. A decoder circuit is also provided. The decoder circuit is electrically coupled to the access transistor of the memory cell by a word line and performs the function of, among other things, turning on the access transistor during a read time interval. According to a preferred aspect of the present invention, a pulse generator circuit is provided for initiating nondestructive reading of a quiescent polarization state of the ferroelectric capacitor by applying a single read pulse to the plate line to sweep a polarization state of the ferroelectric capacitor along a noncoercive portion of its hysteresis curve, during the read time interval. A sense amplifier circuit is also provided. The sense amplifier circuit also has a first input electrically coupled to the bit line and a second input electrically coupled to a reference signal line. The sense amplifier performs the function of driving the bit line to a first potential which represents the quiescent polarization state of the ferroelectric capacitor, preferably before termination of the single read pulse.

10 Claims, 7 Drawing Sheets

FERROELECTRIC MEMORY DEVICES HAVING NONDESTRUCTIVE READ CAPABILITY AND METHODS OF OPERATING SAME

FIELD OF THE INVENTION

The present invention relates to integrated circuit memory devices and methods of operating same, and more particularly, to integrated circuit memory devices having ferroelectric memory cells therein and methods of operating same.

BACKGROUND OF THE INVENTION

Integrated circuit memory devices containing ferroelectric memory cells therein typically contain ferroelectric capacitors to store data. As will be understood by those skilled in the art, ferroelectric capacitors typically comprise a pair of electrodes with a layer of ferroelectric material therebetween having hysteresis characteristics. The ferroelectric material can typically be polarized in a first or second opposite polarization state and this state is nonvolatile inasmuch as the application of a zero potential bias across the pair of electrodes will not result in a change or elimination is of the state. The first and second polarization states can be utilized to reflect the storage of logic 0 and logic 1 data signals, respectively.

Unfortunately, many conventional ferroelectric memory devices perform destructive read operations when the state of polarization of a ferroelectric capacitor (i.e., the data stored therein) is detected. For example, a destructive read operation may occur when the state of polarization of a ferroelectric capacitor is switched from one state to another opposite state upon application of a read voltage across the terminals of the ferroelectric capacitor. To prevent the complete loss of this state (e.g., data), restore operations are typically performed to return the ferroelectric capacitor to the state in existence just prior to the performance of the read operation. Unfortunately, the need to perform restore operations after each read operation increases the effective read cycle time and slows operation of the memory device. Each destructive read operation and each restore operation can also fatigue and imprint the ferroelectric material and reduce the long term reliability of memory devices containing ferroelectric memory cells. Finally, the need to perform restore operations leaves the memory device vulnerable to power failures because the loss of power during the middle of a restore operation may result in the complete loss of data if the data is read in a destructive manner as described above.

To address these limitations associated with conventional ferroelectric memory devices, memory devices have been developed that are capable of performing nondestructive read operations. One such memory device is disclosed in U.S. Pat. No. 5,262,982 to Brassington et al. entitled "Nondestructive Reading of a Ferroelectric Capacitor". FIGS. 1 and 2 are reproductions of FIGS. 5 and 6 from the Brassington et al. patent. In particular, FIG. 1 is an electrical schematic of a integrated circuit memory device which operates in accordance with the timing diagram of FIG. 2.

Referring to FIG. 1, the conventional ferroelectric memory device includes driving lines DL1–DLN, bit lines BL1–BLN and an array of memory cells 100. Each of the memory cells 100 contains a ferroelectric capacitor 104 and an access transistor 102. The ferroelectric capacitor 104 of each memory cell 100 has a first terminal electrically coupled to a respective driving line and a second terminal electrically coupled to a source of a respective access transistor, as illustrated. In addition, the gate electrode of each access transistor is electrically coupled to a respective word line (WL1–WLN). Each bit line (BL1–BLN) is electrically coupled to the drain regions of a column of memory cells and a respective sense amplifying circuit 106. As illustrated, the sense amplifying circuits 106 are responsive to signals generated by a timing control circuit 130.

The steps of performing a nondestructive read operation on the highlighted memory device 100 will now be described with reference to FIG. 2. In particular, upon commencement of a read operation, a positive pulse 140 is applied to the first word line WL1 to turn on a row of access transistors 102 and electrically couple the second terminal of each ferroelectric capacitor 104 in the row to a respective bit line. A first positive pulse 42 is then applied to the first drive line DL1 to initiate a nondestructive read operation. Depending on the value of the data (i.e., logic 1 or logic 0) stored in the ferroelectric capacitor 104, the first bit line BL1 transitions from a precharged level (e.g., logic 0) to one of two levels 78 or 54. A positive pulse 148 is also applied to control line T1 to turn on NMOS transistor 114 and electrically coupled the storage capacitor 110 to the first bit line BL1. The storage capacitor 110 is then charged to a level corresponding to the potential of the bit line at level 78 or 54. The positive pulse 148 is then terminated and followed by a short duration pulse on control line T4 to discharge the first bit line BL1. A positive pulse is then applied to control line T2 to turn on NMOS transistor 124 and electrically coupled storage capacitor 112 to the first bit line BL1. A second negative pulse 56 is then applied to the first drive line DL1. Depending on the value of the data (i.e., logic 1 or logic 0) stored in the ferroelectric capacitor 104, the first bit line BL1 then transitions from a precharged level to one of two levels 88 or 66. The storage capacitor 112 is then charged to a level corresponding to the potential of the bit line at level 88 or 66. Next, a logic 1 pulse is applied to control line T3 to turn on NMOS transistors 116 and 126 and electrically connect the storage capacitors 110 and 112 in parallel so that the charges therein can be combined. The voltage across the storage capacitors 110 and 112 is then fed to a amplifier 120 where it is compared to a reference voltage (e.g., GND) tied to the negative terminal of the amplifier. The output of the amplifier 120 then reflects the value of the data stored in the ferroelectric capacitor 104 undergoing the read operation. For example, if the output of the amplifier is a positive value, it is stored in a latch 132 as logic 1 value, however, if the output is a negative value, it is stored in the latch 132 as logic 0 value. The data stored in the latch 132 is then read out through a data output line DOUT-1. As will be understood by those skilled in the art, the reference voltage is selected at a level between the respective values of the voltages on the storage capacitors at the end of a logic 1 and logic 0 read operation.

As described by the Brassington et al. patent at FIG. 3 thereof, the magnitudes of the pulses 42 and 56 are less than the coercive voltage of the ferroelectric capacitor 104. Thus, the application of the pulses 42 and 56 to the first drive line DL1 during a read operation is insufficient to change the polarization state of the ferroelectric capacitor and, therefore, a restore operation is unnecessary at the completion of a read operation.

Notwithstanding the fact that memory devices capable of performing nondestructive read operations have been developed, there continues to be a need for improved memory devices capable of performing nondestructive read operations in an efficient manner.

SUMMARY OF THE INVENTION

It is therefore an object of the present invention to provide improved integrated circuit memory devices and methods of operating same.

It is another object of the present invention to provide integrated circuit memory devices having ferroelectric memory cells therein that can be read nondestructively and methods of operating same.

It is still another object of the present invention to provide integrated circuit memory devices having memory cells therein that are less susceptible to access fatigue and methods of operating same.

It is still a further object of the present invention to provide integrated circuit memory devices having improved long term reliability and methods of operating same.

These and other objects, advantages and features of the present invention are provided by integrated circuit memory devices that contain an array of ferroelectric memory cells therein and control circuits for enabling the performance of nondestructive read operations. In particular, a preferred integrated circuit memory device contains a ferroelectric memory cell and each memory cell contains a ferroelectric capacitor having a first electrode electrically coupled to a plate line and an access transistor electrically coupled in series between a bit line and a second electrode of the ferroelectric capacitor. A decoder circuit is also provided. The decoder circuit is electrically coupled to the access transistor of the memory cell by a word line and performs the function of, among other things, turning on the access transistor during a read time interval. According to a preferred aspect of the present invention, a pulse generator circuit is provided for initiating nondestructive reading of a quiescent polarization state of the ferroelectric capacitor by applying only a single read pulse to the plate line to sweep a polarization state of the ferroelectric capacitor along a noncoercive portion of its hysteresis curve, during the read time interval. A sense amplifier circuit is also provided. The sense amplifier circuit also has a first input electrically coupled to the bit line and a second input electrically coupled to a reference signal line.

The sense amplifier performs the function of driving the bit line to a first potential which represents the quiescent polarization state of the ferroelectric capacitor, preferably before termination of the single read pulse. To prevent polarization reversal during the read operation (i.e., a destructive read operation), the pulse generator circuit applies the single read pulse to the plate line to sweep a polarization state of the ferroelectric capacitor along only a noncoercive portion of its hysteresis curve.

Depending on the state of the ferroelectric capacitor at the time a read operation is performed, the sense amplifier may also perform the function of refreshing the quiescent polarization state of the ferroelectric capacitor by driving the bit line to a predetermined potential after termination of the single read pulse, but prior to expiration of the read time interval.

DESCRIPTION OF PREFERRED EMBODIMENTS

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

Figure 1:
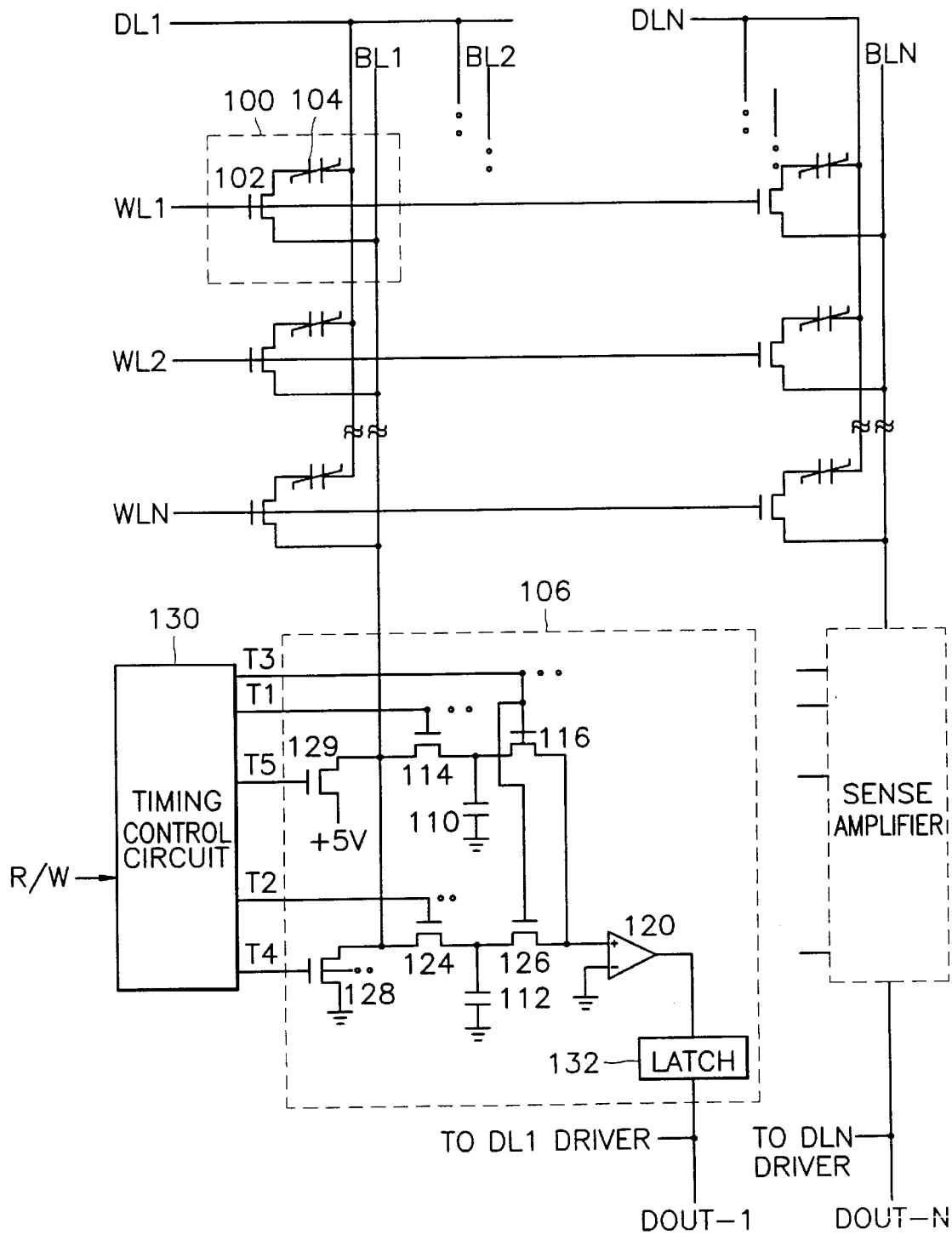
FIG. 1 is an electrical schematic of a conventional integrated circuit memory device according to U.S. Pat. No. 5,262,982.
Figure 2:
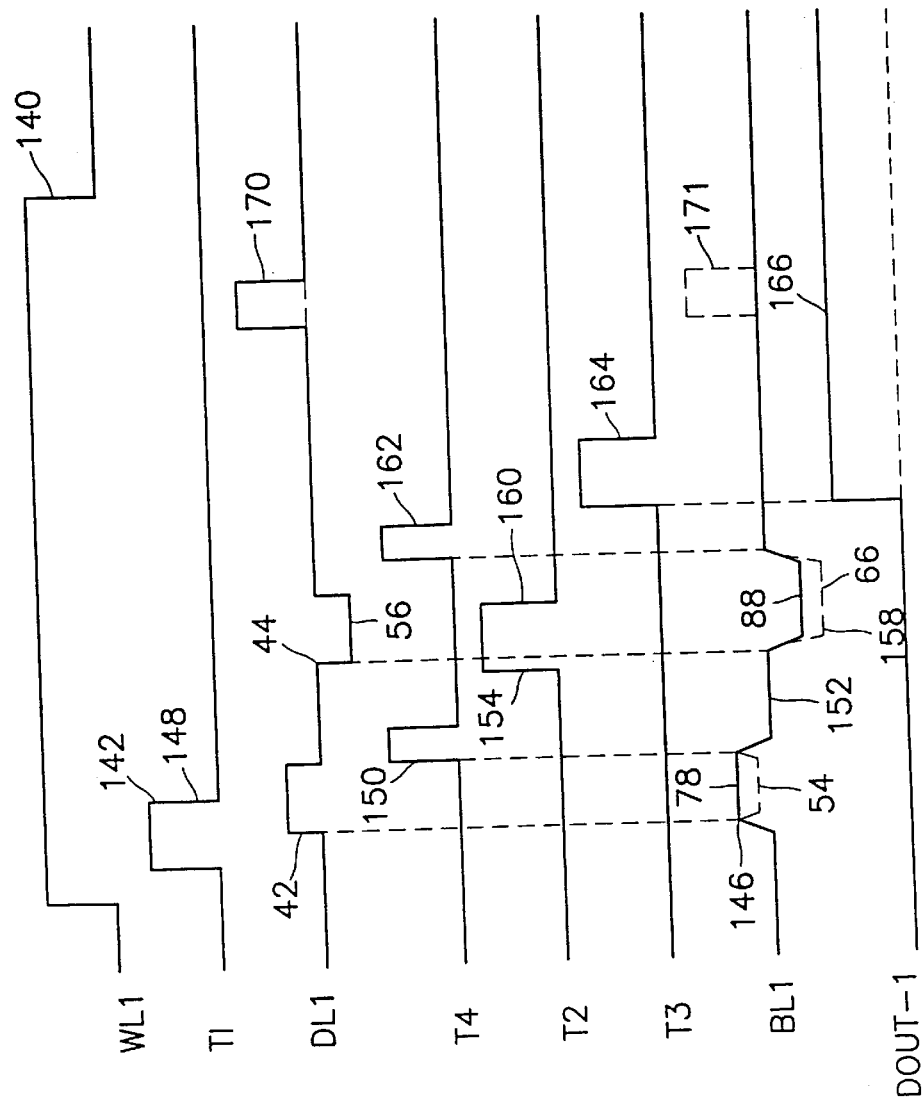
FIG. 2 is a timing diagram illustrating the operation of the memory device of FIG. 1.
Figure 3:
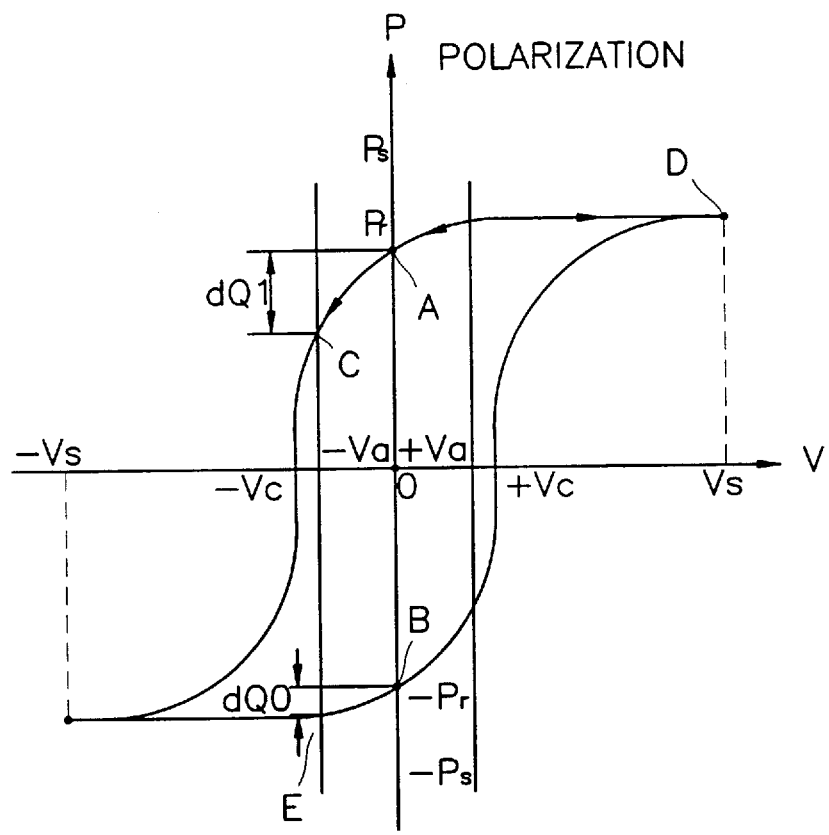
FIG. 3 is a graph of a hysteresis curve of a ferroelectric capacitor with reference lines and notations that illustrate a method of performing a nondestructive read operation according to an embodiment of the present invention.

FIG. 3 shows a hysteresis curve of a ferroelectric capacitor with reference lines and notations that illustrate a method of performing a nondestructive read operation according to an embodiment of the present invention. In particular, if a single read pulse having a predetermined magnitude (−Va) that is less than a magnitude of a coercive voltage (−Vc) is applied to a first electrode of a ferroelectric capacitor, a quantity of electric charge proportional to the magnitude of the applied pulse is typically induced on the second electrode of the ferroelectric capacitor. For example, if the initial polarization state of the ferroelectric capacitor is at point "A" on the hysteresis curve and has a quiescent polarization state of +Pr, an electric charge of dQ1 will be induced on a bit line electrically coupled to the second electrode upon application of the read pulse to the first electrode of the capacitor. When the read pulse is applied, the polarization state of the ferroelectric capacitor will be swept from point "A" to point "C". Alternatively, if the initial polarization state of the ferroelectric capacitor is at point "B" on the hysteresis curve and has a quiescent polarization state of −Pr, an electric charge of dQ0 will be induced on a bit line electrically coupled to the second electrode upon application of the read pulse to the first electrode of the capacitor. Thus, measurement of the magnitude of dQ1 and dQ0 can be used to determine the value of the quiescent polarization state of the ferroelectric capacitor (i.e., the logic value of the data stored in a memory device containing the ferroelectric capacitor). As described more fully hereinbelow, measurement of the magnitude of dQ1 versus dQ0 can be performed by monitoring the induced potential on the bit line upon application of the read pulse and then comparing the induced potential against a reference potential having a level between the values of the induced potential when logic 1 and logic 0 data is stored in the ferroelectric capacitor as +Pr and −Pr polarization states. Upon termination of the read pulse, a self-refresh operation may be performed to sweep the polarization state of the ferroelectric capacitor from point "C" to point "D" and then back to point "A".

Figure 4:
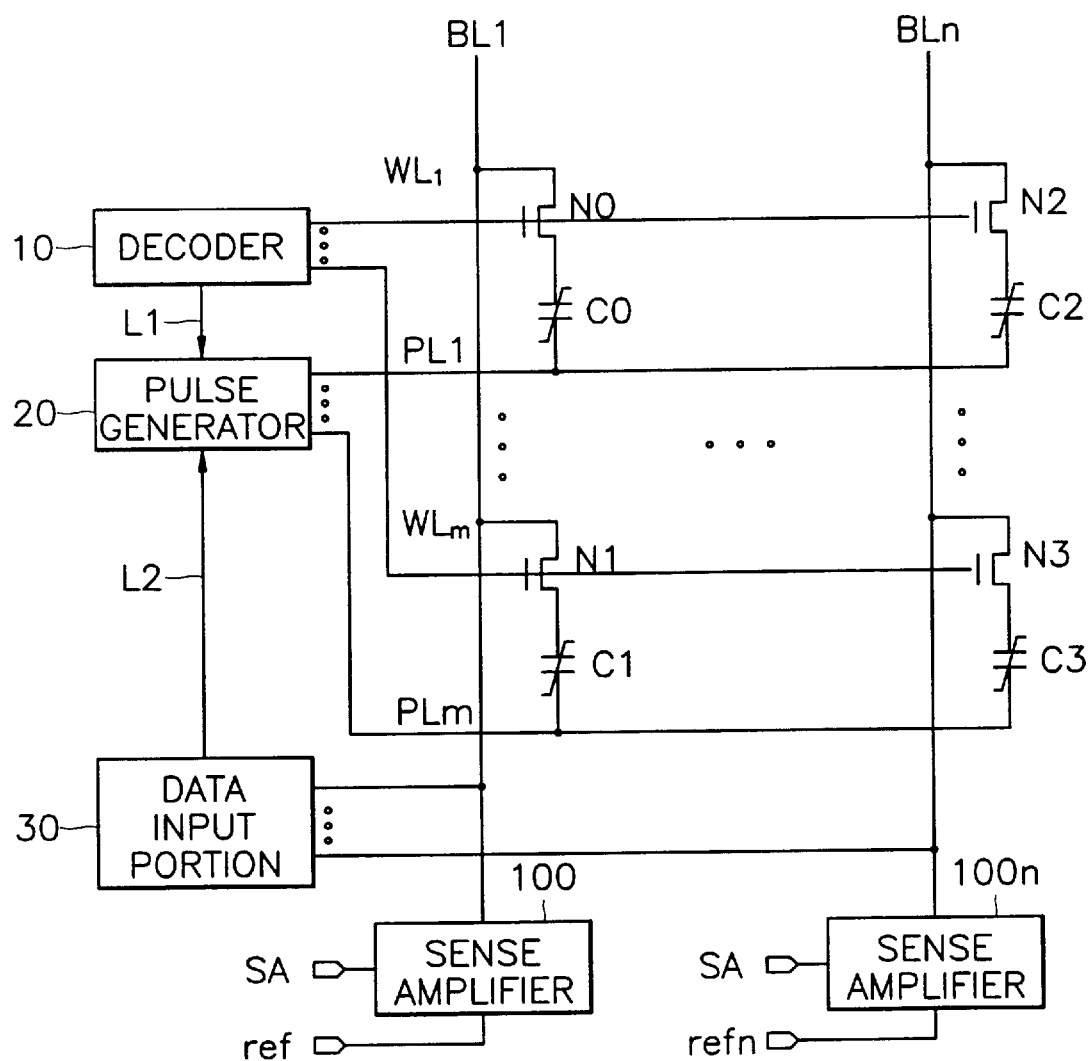
FIG. 4 is an electrical schematic of an integrated circuit memory device that is capable of performing a nondestructive read operation according to an embodiment of the present invention.

Referring to FIG. 4, a preferred integrated circuit memory device having nondestructive read capability includes a ferroelectric memory cell containing a ferroelectric capacitor (C0–Cn) having a first terminal electrically coupled to a plate line (PL1–PLm) and an access transistor (N0–Nn) electrically coupled in series between a second terminal of the ferroelectric capacitor and a bit line (BL1–BLn). Word lines (WL1–WLm) are also electrically coupled to gate electrodes of the access transistors. A decoder circuit 10 is also provided. The decoder circuit 10 is electrically coupled to the word lines and performs the function of turning on rows of access transistors during respective read time intervals. A pulse generator 20 is also provided for driving each of the plate lines PL1–PLn during respective intervals. The pulse generator 20 performs the function of initiating nondestructive reading of a ferroelectric capacitor by sweeping a polarization state of the ferroelectric capacitor along its hysteresis curve (i.e., from point "A" to point "C" or from point "B" to point "E" in FIG. 3). This sweeping step is performed in only a first direction away from a quiescent polarization state (+Pr or –Pr) during the read time interval. This sweeping of the polarization state causes a transfer of charge to a respective bit line. A sense amplifier 100 is also preferably provided for determining a state of the ferroelectric capacitor by amplifying a difference in potential between a respective bit line and a respective reference line "ref", after the single read pulse has been applied.

More specifically, a preferred memory cell array is comprised of a plurality of unit memory cells each including an access transistor N0–Nn having a drain terminal connected to a bit line BL1–BLn and a gate terminal connected to a word line WL1–WLm, and a ferroelectric capacitor C0–Cn having a second electrode connected to a source terminal of a respective access transistor N0–Nn and a first electrode connected to a respective plate line PL1–PLm. A sense amplifier 100 also has first and second inputs connected to a respective bit line and a respective reference signal line ("ref"), respectively. During a read operation, each of the sense amplifiers compares a developed voltage level on the bit line to a reference voltage "ref" and amplifies a difference therebetween to determine the polarization state of the selected ferroelectric capacitor. The bit line and reference signal line are also driven to levels which reflect the state of the ferroelectric capacitor.

A pulse generator 20 connected between a decoder 10 and a data input portion 30 selectively supplies a nondestructive read signal (or write signals of first and second levels) to the first electrode of a capacitor during a time interval shorter than a read time interval in which a word line, selected by a decoding operation of the decoder 10, is enabled. That is, the pulse generator 20 in a write mode selectively supplies a write signal having one positive pulse of a constant first level or a second level, to the first electrode of the ferroelectric capacitor. In a read mode, the pulse generator 20 supplies a nondestructive read signal having a positive pulse of a third level to the first electrode. Accordingly, in the write mode, external data applied through the data input portion 30 is written to the memory cell, and in the read mode the memory cell data is read nondestructively by the sense amplifier without changing the polarization state of the ferroelectric capacitor.

Figure 9:
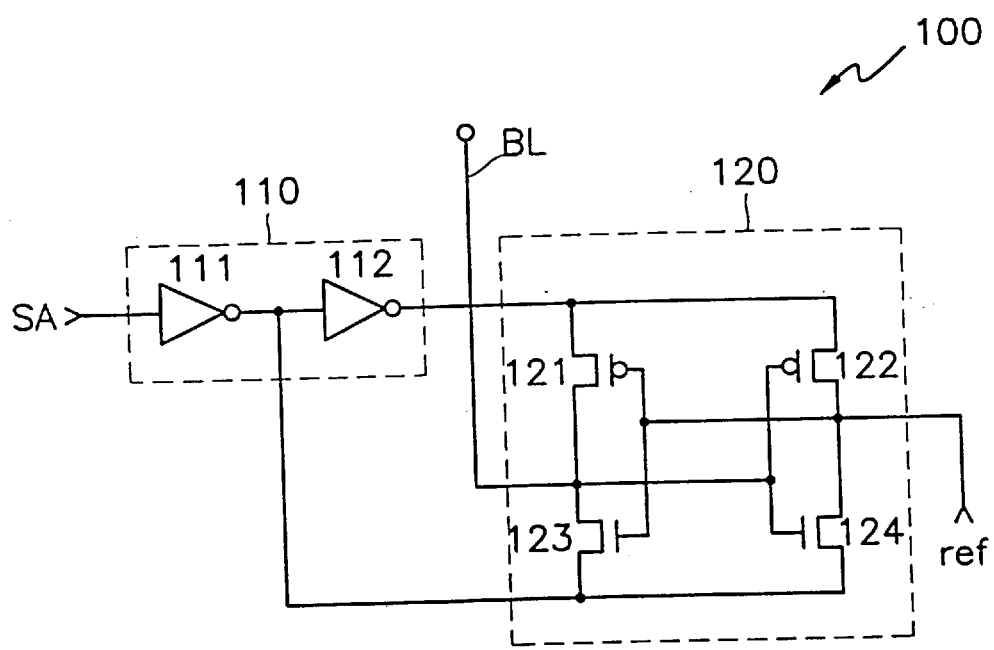
FIG. 9 is an electrical schematic of the sense amplifier 100 of FIG. 4.

FIG. 9 is a circuit diagram showing the construction of exemplary sense amplifiers 100 through 100n of the ferroelectric memory device shown in FIG. 4. Referring to FIG. 9, the sense amplifier includes a driving portion 110 and a latch sensing portion 120. The driving portion 110 is comprised of two inverters 111 and 112 that are connected in series with each other. The latch sensing portion 120 is comprised of two PMOS and two NMOS transistors 121 through 124 having gate terminals which are cross-coupled.

Figure 5:
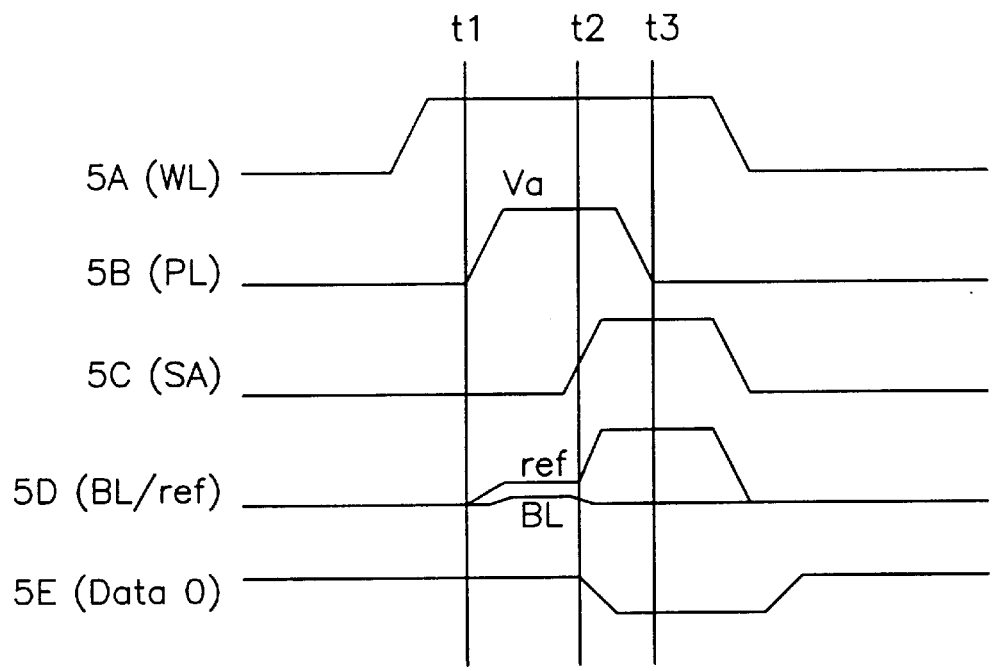
FIGS. 5–6 are timing diagrams that illustrate performance of nondestructive read operations in accordance with the present invention.

FIG. 5 is a timing diagram that illustrates a read operation performed on a memory cell storing a logic "0" data value. Referring to FIG. 5, a signal having a waveform 5A is supplied by the decoder 10 to a selected word line (WL1-WLm) connected to a gate of an NMOS access transistor. A nondestructive read signal PL, shown as a pulse waveform, is supplied by the pulse generator 20 to the first electrode of the ferroelectric capacitor connected to the selected NMOS access transistor. Also, when a sensing operation signal SA is then applied to a sense amplifier 100 as shown in waveform 5C, the electric potentials of two input terminals BL and ref of the sense amplifier (shown in FIG. 9) have the waveform 5D, and the output of the sense amplifier 100 shows a waveform 5E, in which data '0' is shown. In particular, in the event the initial state of the ferroelectric capacitor is at the polarization state B of FIG. 3, a pulse waveform 5B having a voltage level as high as that of the nondestructive voltage level Va, is supplied during the period of t1–t3. In FIG. 5, during the period of t1–t2, the change of electric charge dQ0 is transferred to the selected bit line. Accordingly, the levels of the two input portions BL and ref of the sense amplifier are separated by a small difference as shown in waveform 5D. Subsequently, during the period of t2–t3, the sense amplifier 100, which performs a sensing operation in response to the sensing operation signal SA, compares the bit line voltage BL with a reference voltage "ref" supplied to the input terminal and amplifies the difference between the two levels, and evaluates the data as "0". At this time, the reference voltage "ref" increases to a predetermined level relative to a ground voltage level. Here, it is preferable that the level of the reference voltage ref be initially set to half of the level obtained by summing a voltage dV0, induced by charge dQ0 in the case of data of logic level "0", with a voltage dV1 induced by the charge dQ1 in the case of data of logic level "1".

Figure 6:
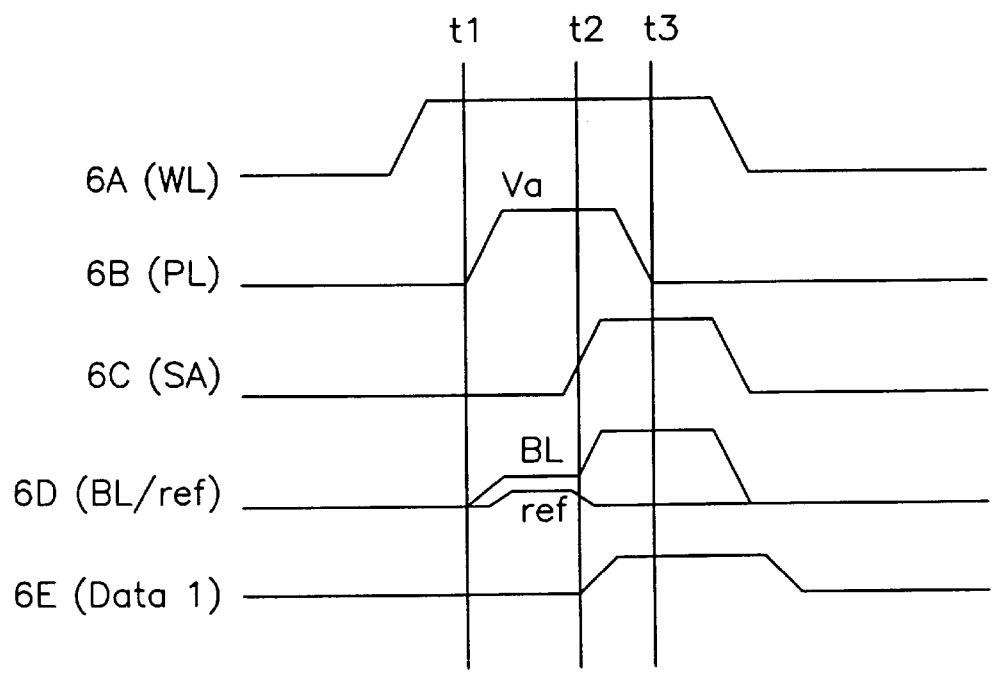

Referring to FIG. 6, a signal having a waveform as shown in 6A is supplied to one selected by a decoder 10 from word lines WL1 through WLm connected respectively to gates of the NMOS access transistors of FIG. 4. A nondestructive read signal PL, as shown in waveform 6B, is supplied by the pulse generator 20 to the ferroelectric capacitor connected to the selected NMOS access transistor. Also, when a sensing operation signal SA is applied to a sense amplifier 100 according to timing as shown in a waveform 6C, the electric potential of two input terminals BL and ref of the sense amplifier of FIG. 9 have a waveform 6D, and the output of the sense amplifier 100 shows a waveform 6E, in which data '1' is shown. In particular, in the event an initial state of the ferroelectric capacitor is at the polarization state A of FIG. 3, a pulse waveform 6B, having a voltage level as high as that of the nondestructive voltage level Va, is supplied during a period of t1–t3. In FIG. 6, during a period of t1–t2, a change of electric charge dQ1, corresponding to the nondestructive voltage level Va in the state A of the ferroelectric capacitor, is transferred to the selected bit line. Accordingly, the levels of the two input terminals BL and ref of the sense amplifier are separated by a small difference as shown in waveform 6D. Subsequently, during the period of t1–t3, the sense amplifier 100 performs a sensing operation according to the sensing operation signal SA, compares a voltage dV1 corresponding to charge dQ1 supplied to the input terminal BL with a reference voltage supplied to the input terminal ref, amplifies the difference between the two levels, and then evaluates the data as '1'. At this time, the voltage of the bit line increases to a predetermined level with reference to a ground voltage level. In FIGS. 5 and 6, the level of the nondestructive read signal PL around a point of time t3 descends to 0 Volts to generate a refresh operation to realize the nondestructive read of the ferroelectric capacitor. That is, when the level of the nondestructive read signal PL descends to 0 Volts after the point of time t3, the potential difference between the electrodes of the ferroelectric capacitor C0 becomes a voltage as high as a saturation voltage Vs of FIG. 3 at point "D". Accordingly, the capacitor is refreshed to its initial state by the saturation voltage, to maintain the capacitor in a stable state.

According to the operational principle based on the pulse response characteristic of the capacitor, the nondestructive read signal is supplied only to the first electrode of the capacitor during the read operation, in a time interval shorter than the time interval in which a word line selected by a decoder 10 is enabled, to thereby read the level of the nondestructively-sensed data without changing the state of polarization of the ferroelectric capacitor. Accordingly, read cycle time for reading data is reduced, to realize a read operation at a high speed.

Figure 7:
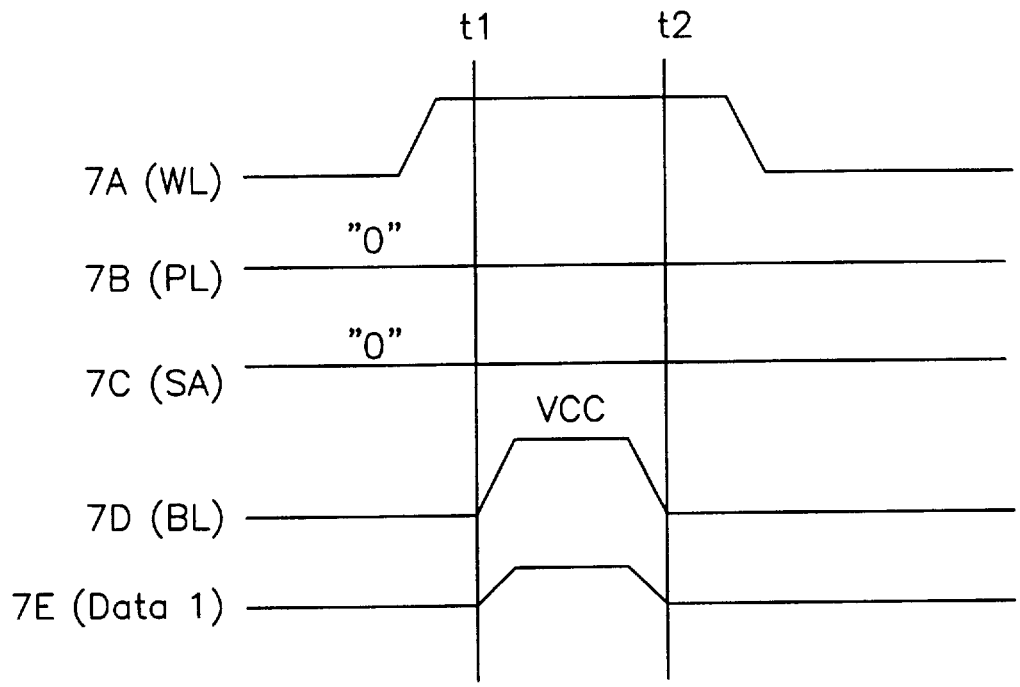
FIGS. 7–8 are timing diagrams that illustrate performance of write operations in accordance with the present invention.

Referring to FIG. 7, a signal having a waveform 7A is supplied to one selected by a decoder 10 from word lines WL1 through WLm connected respectively to gates of the NMOS access transistors of FIG. 4. A write signal PL of a constant level (e.g., 0 Volts), is supplied by the pulse generator 20 to the first electrode of the ferroelectric capacitor connected to the selected NMOS access transistor, the waveform of which is shown in 7B. Also, when a sensing operation signal SA of the sense amplifier 100 is fixed at 0 Volts as in the waveform 7C, the electric potential of the bit line receiving the output voltage of the data input portion 30 becomes a high level as in the waveform 7D, to thereby place the ferroelectric capacitor in the state of polarization of point A of FIG. 3, regardless of the initial state. This means a write operation of data '1' to the ferroelectric capacitor occurs during a period of t1–t2.

Figure 8:
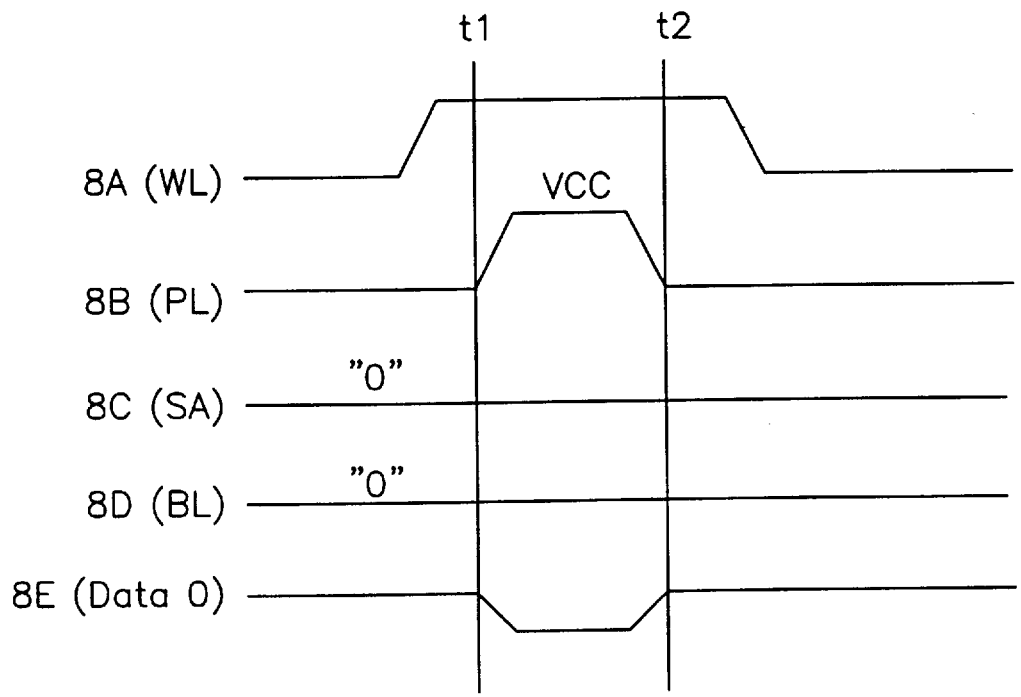

Referring to FIG. 8, a signal having a waveform 8A is supplied to one selected by a decoder 10 from word lines WL1 through WLm connected respectively to gates of the NMOS access transistors of FIG. 4. A write signal PL having a pulse of a second level, for example, a power supply voltage Vcc, is supplied by the pulse generator 20 to the second plate of the ferroelectric capacitor connected to the selected NMOS access transistor, the waveform of which is shown in 7B, during a period of t1–t2. Also, when a sensing operation signal SA of the sense amplifier 100 is fixed at 0 Volts as in the waveform 8C, the electric potential of the bit line receiving the output voltage of the data input portion 30 becomes 0 Volts as in the waveform 8D, to thereby place the ferroelectric capacitor in a state of polarization of point "B" of FIG. 3, regardless of the initial state. This means a write operation of data '0' to the ferroelectric capacitor occurs during a period of t1–t2. In the above write mode, the level of the write signal PL is the first or second level according to the logic state of data to be written, so that the potential difference between the second electrode of the ferroelectric capacitor (connected through the drain/source channel of the NMOS access transistor) and the first electrode, has a level of saturation voltage Vs or –Vs.

According to the ferroelectric memory device of the present invention, only a single pulse is supplied during the read mode, to nondestructively sense data without changing a state of polarization of the ferroelectric capacitor. Therefore, read cycle time for reading data is reduced. Also, due to the single pulse, the life span of the ferroelectric capacitor can increase.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. An integrated circuit memory device, comprising:
   a ferroelectric memory cell containing a ferroelectric capacitor having a first electrode electrically coupled to a plate line and an access transistor electrically coupled in series between a bit line and a second electrode of the ferroelectric capacitor;
   decoder means, electrically coupled to the memory cell, for turning on the access transistor during a read time interval;
   means, coupled to the plate line, for initiating nondestructive reading of a quiescent polarization state of the ferroelectric capacitor by applying a single read pulse to the plate line to sweep a polarization state of the ferroelectric capacitor along a noncoercive portion of its hysteresis curve, during the read time interval; and
   sense amplifier means, having an input electrically coupled to the bit line, for driving the bit line to a first potential which represents the quiescent polarization state of the ferroelectric capacitor, before termination of the single read pulse.

2. The memory device of claim 1, wherein said means for initiating nondestructive reading comprises means for applying a single read pulse to the plate line to sweep a polarization state of the ferroelectric capacitor along only a noncoercive portion of its hysteresis curve when the single read pulse is being applied.

3. The memory device of claim 1, further comprising means coupled to said sense amplifying means for refreshing the quiescent polarization state of the ferroelectric capacitor, before expiration of the read time interval.

4. The memory device of claim 3, further comprising means coupled to said sense amplifying means for refreshing the quiescent polarization state of the ferroelectric capacitor, after termination of the single read pulse.

5. The memory device of claim 1, wherein said means for initiating nondestructive reading comprises means for initiating nondestructive reading of a quiescent polarization state of the ferroelectric capacitor by applying a single read pulse to the plate line to sweep a polarization state of the ferroelectric capacitor in only a first direction away from the quiescent polarization state before termination of the single read pulse.

6. An integrated circuit memory device, comprising:
   a ferroelectric memory cell containing a ferroelectric capacitor having a first electrode electrically coupled to a plate line and an access transistor electrically coupled in series between a second electrode of the ferroelectric capacitor and a bit line;
   a word line electrically coupled to a gate electrode of said access transistor;
   a reference signal line;
   decoder means, electrically coupled to the word line, for turning on the access transistor during a read time interval;
   means, coupled to the plate line, for initiating nondestructive reading of a quiescent polarization state of the ferroelectric capacitor by applying a single read pulse to the first electrode to sweep a polarization state of the ferroelectric capacitor along its hysteresis curve in a first direction away from the quiescent polarization state, during the read time interval; and
   sense amplifier means, having a first input electrically coupled to said reference signal line and a second input electrically coupled to the bit line, for determining a state of the ferroelectric capacitor by amplifying a difference in potential between the first and second inputs before termination of the single read pulse.

7. The memory device of claim 6, wherein said means for initiating nondestructive reading comprises means for applying a single read pulse to the first electrode to sweep a polarization state of the ferroelectric capacitor along only a noncoercive portion of the hysteresis curve during the read time interval.

8. The memory device of claim 7, further comprising means for refreshing the quiescent polarization state of the ferroelectric capacitor, after termination of the single read pulse.

9. A method of nondestructively reading a state of a ferroelectric memory cell containing an access transistor and a ferroelectric capacitor therein in series between a bit line and a plate line, said method comprising the steps of:

turning on the access transistor during a read time interval to thereby electrically couple first and second electrodes of the ferroelectric capacitor to the plate and bit lines, respectively;

sweeping a polarization state of the ferroelectric capacitor along only a noncoercive portion of its hysteresis curve by applying a single read pulse to the plate line; and driving the bit line to a first potential that represents the quiescent polarization state of the ferroelectric capacitor before termination of the single read pulse.

10. The method of claim 9, wherein said driving step is commenced before termination of the single read pulse.

* * * * *